(12) United States Patent  (10) Patent No.: US 8,007,676 B2
So et al.  (45) Date of Patent: Aug. 30, 2011

(54) SLURRY COMPOSITIONS, METHODS OF PREPARING SLURRY COMPOSITIONS, AND METHODS OF POLISHING AN OBJECT USING SLURRY COMPOSITIONS

(75) Inventors: Jae-Hyun So, Dongjak-gu (KR); Sung-Taek Moon, Suwon-si (KR); Dong-Jun Lee, Seoul (KR); Nam-Soo Kim, Suwon-si (KR); Bong-Su Ahn, Seoul (KR); Kyoung-Moon Kang, Gwangmyeong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 707 days.

(21) Appl. No.: 12/128,675

(22) Filed: May 29, 2008

(65) Prior Publication Data

US 2008/0227296 A1 Sep. 18, 2008

Related U.S. Application Data

(62) Division of application No. 11/205,029, filed on Aug. 17, 2005, now Pat. No. 7,402,261.

(30) Foreign Application Priority Data

Aug. 18, 2004 (KR) .................................. 2004-64977

(51) Int. Cl.
*C03C 15/00* (2006.01)
(52) U.S. Cl. ............... 216/88; 216/37; 216/67; 216/99; 216/102; 438/689; 438/690; 438/691; 438/692; 51/307; 51/308; 51/309

(58) Field of Classification Search ................. 216/37, 216/67, 99–102; 438/689–692; 51/307–309
See application file for complete search history.

(56) References Cited

U.S. PATENT DOCUMENTS

| | | | |
|---|---|---|---|
| 3,933,982 A * | 1/1976 | Kushibe | 423/272 |
| 5,340,370 A | 8/1994 | Cadien et al. | |
| 5,527,423 A | 6/1996 | Neville et al. | |
| 5,958,288 A | 9/1999 | Mueller et al. | |
| 5,980,775 A | 11/1999 | Grumbine et al. | |
| 6,136,711 A * | 10/2000 | Grumbine et al. | 438/692 |
| 6,465,553 B2 | 10/2002 | Colegrove | |
| 6,503,418 B2 | 1/2003 | Sahota et al. | |
| 6,660,639 B2 | 12/2003 | Li et al. | |
| 6,905,673 B2 | 6/2005 | Rajaiah et al. | |
| 7,087,529 B2 * | 8/2006 | Fang et al. | 438/692 |
| 2003/0196386 A1 | 10/2003 | Hattori et al. | |
| 2004/0006924 A1 * | 1/2004 | Scott et al. | 51/307 |
| 2005/0090106 A1 | 4/2005 | Bian | |
| 2005/0236601 A1 | 10/2005 | Liu et al. | |

FOREIGN PATENT DOCUMENTS

| | | |
|---|---|---|
| JP | 2000-001666 | 1/2000 |
| KR | 2001-0099998 | 11/2001 |
| WO | WO 99/53532 | 10/1999 |

* cited by examiner

*Primary Examiner* — Lan Vinh
*Assistant Examiner* — Maki Angadi
(74) *Attorney, Agent, or Firm* — Volentine & Whitt, PLLC

(57) ABSTRACT

A slurry composition includes an acidic aqueous solution and one or both of, an amphoteric surfactant and a glycol compound. Examples of the amphoteric surfactant include a betaine compound and an amino acid compound, and examples of the amino acid compound include lysine, proline and arginine. Examples of the glycol compound include diethylene glycol, ethylene glycol and polyethylene glycol.

15 Claims, 4 Drawing Sheets

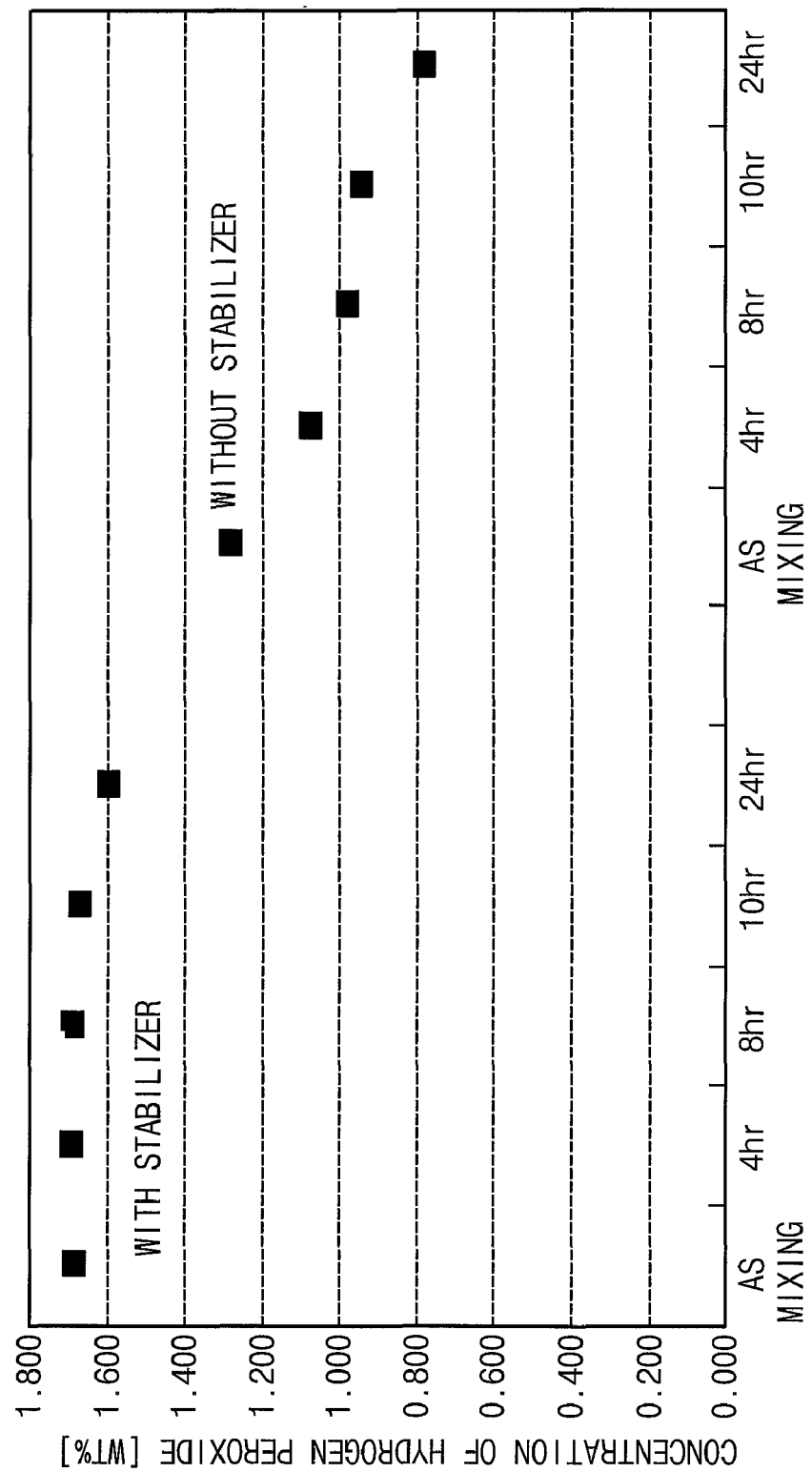

US 8,007,676 B2

SLURRY COMPOSITIONS, METHODS OF PREPARING SLURRY COMPOSITIONS, AND METHODS OF POLISHING AN OBJECT USING SLURRY COMPOSITIONS

CROSS REFERENCE TO RELATED APPLICATION

This is a Divisional application of U.S. non-provisional application Ser. No. 11/205,029, filed Aug. 17, 2005. In addition, a claim of priority under 35 USC § 119 is made to Korean Patent Application No. 2004-64977, filed Aug. 18, 2004. The entire contents of both applications are incorporated herein by reference.

BACKGROUND OF THE INVENTION

1. Field of the Invention

The present invention relates to slurry compositions, to methods of preparing the slurry compositions, and to methods of polishing an object using slurry compositions. The slurry compositions and methods may be utilized in the fabrication of semiconductor devices.

2. Description of the Related Art

Chemical mechanical polishing (CMP) is commonly utilized to planarize layers, such as metal layers, during the fabrication of semiconductor devices. CMP processes are generally characterized by rotating a pad relative to the surface of a wafer with a slurry composition interposed therebetween. Chemical reaction between the slurry composition and materials of the wafer, coupled with mechanical polishing, result in the smoothing (planarizing) of surface features of one or more layers on the wafer.

However, conventional slurry compositions generally suffer from a number of drawbacks. For example, an oxide layer may be undesirably eroded as the result of differing polishing rates among various layers of the wafer, such as metal layers, barrier layers, insulating layers, and so on. Also, it is known to add an oxidizing agent to the slurry composition in order to increase the polishing rate. Unfortunately, the oxidizing agent can corrode the metal layer being polished, resulting in electrical disconnects with later formed metal layers. The result is often operational failure of the semiconductor device being fabricated.

Examples of CMP slurry compositions are presented in U.S. Pat. No. 5,980,775, issued to Grumbine et al., and U.S. Pat. No. 5,958,288, issued to Mueller et al. Generally, these slurry compositions include peroxide as the oxidizing agent, and a metal catalyst for improving the oxidizing activity of the oxidizing agent in an effort to increase the polishing rate. Other examples are presented in U.S. Pat. No. 5,340,370, issued to Cadien et al., and U.S. Pat. No. 5,527,423, issued to Neville et al. These CMP slurry compositions generally include an unusually high amount of oxidizing agent in an effort to obtain a high polishing speed.

However, as suggest previously, the high concentration of oxidizing agent can cause problems. This is particularly true in the case of a metal layer, which can be etched and damaged by the conventional slurry composition. Further, voids can be disadvantageously formed in metal plugs by the oxidizing agent of conventional slurry compositions.

FIGS. 1 and 2 are SEM images showing examples of damage to a metal layer that can result from a CMP process using a conventional slurry composition. In particular, FIG. 1 is a SEM image showing the metal layer damage that can be generated in the metal CMP process using a conventional SS W2000 slurry (trade name manufactured by Microelectronics Co., U.S.A, and FIG. 2 is a SEM picture showing the metal layer damage that can be generated in the metal CMP process using a conventional W slurry (trade name manufactured by Ceil Industries Inc., Korea).

Referring to FIG. 1, when the metal layer is polished to form a metal plug using the SS W2000 slurry, voids having diameters of about 900 Å are observed at an upper portion of the metal layer. Referring to FIG. 2, when the metal layer is polished to form a metal plug using the W slurry, voids having diameters of about 600 Å are observed at the upper portion of the metal layer. The presence of such voids increases the electrical resistance of the metal plugs, thus potentially causing operational failures.

In addition, in order to polish the metal layer with a constant polishing rate, it is desirable to maintain a constant concentration of the oxidizing agent. However, the oxidizing agent (such as a peroxide compound) generally included in a conventional slurry composition is easily decomposed in water, resulting in a varying concentration of the oxidizing agent. Thus, the metal layer is not be polished at a constant polishing rate, and furthermore, the polishing rate is reduced as the polishing process proceeds.

SUMMARY OF THE INVENTION

In accordance with one aspect of the invention, a slurry composition is provided which include an acidic aqueous solution, an amphoteric surfactant, and a glycol compound.

In accordance with another aspect of the present invention, a slurry composition is provided which includes an oxidizing agent, an abrasive, a carboxylic acid, an amphoteric surfactant, a glycol compound and pure water.

In accordance with still another aspect of the present invention, a slurry composition is provided which includes an oxidizing agent, an abrasive, a carboxylic acid, an amphoteric surfactant, a glycol compound, a pH-controlling agent and pure water.

In accordance with yet another aspect of the present invention, a slurry composition is provided which includes an acidic aqueous solution and an amphoteric surfactant.

In accordance with another aspect of the present invention, a slurry composition is provided which includes an acidic aqueous solution and a glycol compound.

In accordance with yet another aspect of the present invention, a method of preparing a slurry composition is provided which includes mixing an acid, an abrasive, a carboxylic acid and pure water to prepare a first mixture, adding a glycol compound and an amphoteric surfactant to the first mixture to prepare a second mixture, and adding a peroxide compound to the second mixture.

In accordance with still another aspect of the present invention, a method of polishing an object is provided which includes preparing a slurry composition including an acidic aqueous solution, an amphoteric surfactant and a glycol compound, providing the slurry composition to a polishing pad, and polishing a surface of an object by contacting the polishing pad with the slurry composition against the surface of the object.

BRIEF DESCRIPTION OF THE DRAWINGS

The above and other aspects and features of the present invention will become readily apparent with reference to the following detailed description when considered in conjunction with the accompanying drawings wherein:

FIG. 6 is a graph illustrating the change in hydrogen peroxide concentration with an elapsed time after preparing a slurry composition.

DETAILED DESCRIPTION OF THE INVENTION

Figure 1:
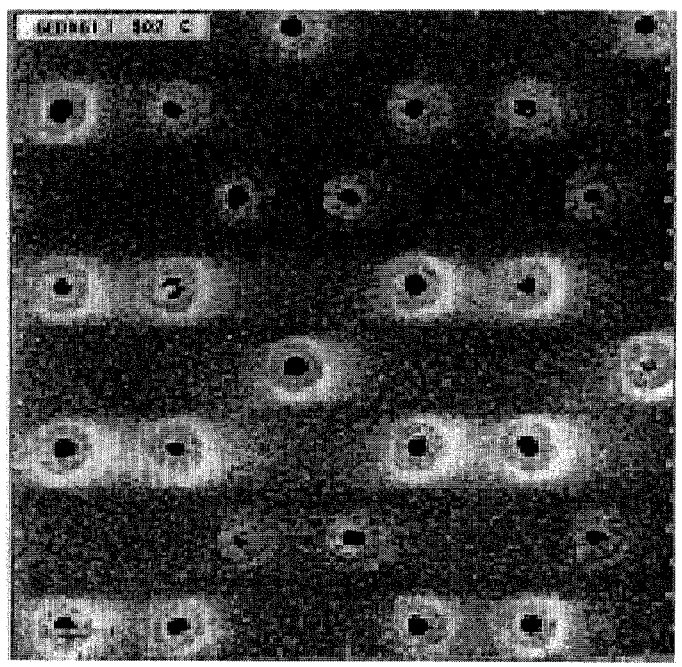
FIGS. 1 and 2 are SEM pictures showing metal layer damage resulting from a CMP process using a conventional slurry composition.
Figure 2:
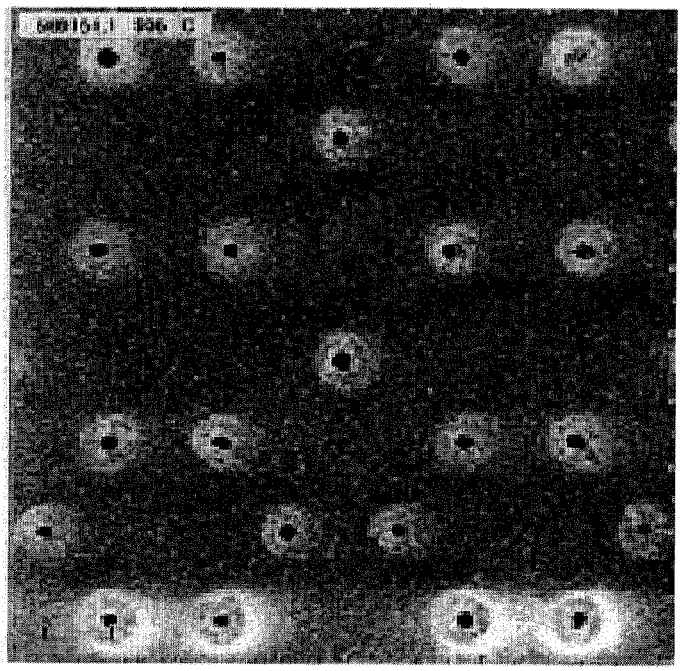

The present invention now will be described more fully hereinafter with reference to the accompanying drawings, in which embodiments of the invention are shown. This invention may, however, be embodied in many different forms and should not be construed as limited to the embodiments set fourth herein; rather, these embodiments are provided so that this disclosure will be thorough and complete, and will fully convey the scope of the invention to those skilled in the art.

Slurry Composition

The slurry compositions of exemplary embodiments of the present invention include an acidic aqueous solution and one or both of an amphoteric surfactant and a glycol compound.

The amphoteric surfactant may be adsorbed on a surface of the metal layer to form a protective layer which serves as a corrosion inhibitor for the metal layer. The protective layer may prevent or minimize contact between the oxidizing agent and the metal layer in the polishing process, thus preventing or minimizing damage to the metal layer which would otherwise be caused by the oxidizing agent. The amphoteric surfactant may also be adsorbed to surfaces of abrasive particles of the slurry, thus functioning as an agglomeration inhibitor of the abrasive. Accordingly, improved dispersion characteristics may result.

Non-limiting examples of the amphoteric surfactant include a betaine compound and an amino acid compound. These can be used individually or in a mixture.

Non-limiting examples of the amino acid compound include lysine, proline, and arginine. These can be used individually or in a mixture of two or more.

When the slurry composition includes the amphoteric surfactant of less than about 0.0002 weight percent based on a total weight of the slurry composition, the slurry composition may not sufficiently protect against corrosion of the metal layer. On the other hand, when the concentration of the amphoteric surfactant in the slurry composition is greater than about 0.08 weight percent, the polishing rate may decrease, thereby deteriorating polishing efficiency. Therefore, the slurry composition preferably includes about 0.0002 to about 0.08 weight percent of the amphoteric surfactant based on the total weight of the slurry composition. The slurry composition more preferably includes about 0.002 to about 0.008 weight percent of the amphoteric surfactant.

The glycol compound may improve the stability of the oxidizing agent. That is, for example, the oxidizing agent (e.g., hydrogen peroxide) of the slurry may easily decompose in water, thus reducing the oxidation power of the slurry composition. The glycol compound may reduce decomposition of the hydrogen peroxide to improve the stability of slurry composition and enhance the polishing efficiency.

Non-limiting examples of the glycol compound include diethylene glycol, ethylene glycol, and polyethylene glycol. These can be used individually or in a mixture of two or more.

When the glycol compound is polyethylene glycol and a molecular weight of the polyethylene glycol in the slurry composition is greater than about 100,000, a viscosity of the slurry composition may be excessively augmented causing non-uniform polishing. Thus, when the glycol compound is polyethylene glycol, the molecular weight of polyethylene glycol is preferably less than or substantially equal to about 100,000.

When the slurry composition includes less than about 0.05 weight percent of the glycol compound, the oxidizing agent may not be sufficiently stabilized. On the other hand, when a concentration of the glycol compound is greater than about 10 weight percent, the viscosity of the slurry composition may increase excessively causing non-uniform polishing. Thus, the slurry composition of an embodiment of the invention preferably includes about 0.05 to about 10 weight percent of the glycol compound based on the total weight of the slurry composition. The slurry composition more preferably includes about 0.5 to about 1 weight percent of the glycol compound.

As described above, the slurry composition of the present invention may include the amphoteric surfactant and/or the glycol compound so that the corrosion of the metal layer may be effectively prevented and also the stability of the oxidizing agent may be enhanced. In addition, the slurry composition includes the acidic aqueous solution so as to polish the object more efficiently. The acidic aqueous solution may include an oxidizing agent, an abrasive, a carboxylic acid and pure water.

The slurry compositions of embodiments of the present invention may also include an oxidizing agent that may chemically oxidize a metal layer so that the chemically oxidized metal layer may be mechanically polished using an abrasive included in the composition. The oxidizing agent may include a peroxide compound and an acid. By employing these two oxidizing agents, the oxidizing power of the slurry composition may be easily controlled and a desirable polishing rate of the object may be obtained.

Non-limiting examples of the peroxide compound include hydrogen peroxide, benzoyl peroxide, calcium peroxide, barium peroxide, and sodium peroxide. These can be used individually or in a mixture of two or more.

When the slurry composition includes less than about 0.1 weight percent of the peroxide compound based on the total weight of the slurry compound, the oxidation power may be weakened. On the other hand, when the concentration of the peroxide compound is greater than about 10 weight percent, the metal layer may be excessively corroded. Therefore, the slurry composition of the present embodiments preferably includes about 0.1 to about 10 weight percent of the peroxide compound. The slurry composition more preferably includes about 0.5 to about 5 weight percent of the peroxide compound.

Non-limiting examples of the acid include nitric acid, sulfuric acid, hydrochloric acid, and phosphoric acid. These can be used individually or in a mixture of two or more.

When the slurry composition includes less than about 0.001 weight percent of the acid, the oxidation power may be weakened and the polishing rate may be reduced. On the other hand, when the slurry composition includes greater than about 0.1 weight percent of the acid, erosion of the oxide layer and corrosion of the metal layer may easily occur. Therefore, the slurry compositions of the present embodiments preferably includes about 0.001 to about 0.1 weight percent of the acid based on the total weight of the slurry composition. The slurry compositions more preferably include about 0.001 to about 0.05 weight percent of the acid.

In order to reduce a decrease in the oxidation power of the slurry composition caused by decomposition of the hydrogen peroxide, for example, the slurry composition of the present embodiments may also include a carboxylic acid. The carboxylic acid may serve as an oxidizing agent stabilizer so that the polishing efficiency and the stability of the slurry composition may be improved.

Non-limiting examples of the carboxylic acid include acetic acid, citric acid, glutaric acid, glycolic acid, formic acid, lactic acid, malic acid, maleic acid oxalic acid, phthalic acid, succinic acid, and tartaric acid. These can be used individually or in a mixture of two or more.

When the slurry composition includes less than about 0.01 weight percent of the carboxylic acid, the oxidizing agent may not be sufficiently stabilized and a constant concentration of the oxidizing agent may not be maintained. On the other hand, when the slurry composition includes greater than about 10 weight percent of the carboxylic acid, dispersion characteristics of the slurry composition may be deteriorated. Therefore, the slurry composition of the present embodiments preferably includes about 0.01 to about 10 weight percent of the carboxylic acid based on the total weight of the slurry composition. The slurry composition more preferably includes about 0.1 to about 2 weight percent of the carboxylic acid.

The slurry composition of the present embodiments may also include an abrasive.

Non-limiting examples of the abrasive may include silica, alumina, ceria, zirconia, and titania. These can be used individually or in a mixture of two or more.

When the slurry composition includes less than about 0.1 weight percent of the abrasive, the polishing rate of the object may be reduced. On the other hand, when the slurry composition includes greater than about 20 weight percent of the abrasive, the oxide layer may be eroded and the metal layer may be scratched. Therefore, the slurry composition of the present embodiments preferably includes about 0.1 to about 20 weight percent of the abrasive based on the total weight of the slurry composition. The slurry composition more preferably includes about 1 to about 7 weight percent of the abrasive.

The slurry composition of the present embodiments may further include pure water. For example, the slurry composition may include ultra pure water or deionized water.

In another exemplary embodiments, the slurry composition includes an oxidizing agent, an abrasive, a carboxylic acid, a pH-controlling agent, and pure water. The oxidizing agent, the abrasive and the carboxylic acid may be the same as those described previously.

The pH-controlling agent is used to obtain a slurry composition having a suitable pH range. When the metal layer being polished includes, for example, tungsten, aluminum, or copper, the CMP process may be efficiently carried out in a pH of about 1 to about 6. Preferably, however, the slurry composition has a pH of about 2 to about 4 in the case of tungsten, and a pH of about 4 to 6 in the cases of aluminum and copper.

Non-limiting examples of the pH-controlling agent include potassium hydroxide (KOH) and tetramethylammonium hydroxide (TMAH).

The slurry composition may include about 0.001 to about 1 weight percent of the pH-controlling agent based on the total weight of the slurry composition.

In another exemplary embodiments, the slurry composition includes an acidic aqueous solution and an amphoteric surfactant such as those described in detail previously. In this case, the slurry composition preferably includes, based on a total weight of the slurry composition, about 0.0002 to about 0.08 weight percent of the amphoteric surfactant, with all or a portion of the remainder being an acidic aqueous solution. The slurry composition more preferably includes about 0.002 to about 0.008 weight percent of the amphoteric surfactant.

In yet another exemplary embodiment, the slurry composition includes an acidic aqueous solution and a glycol compound such as those described previously in detail. In this case, the slurry composition preferably includes, based on a total weight of the slurry composition, about 0.05 to about 10 weight percent of the glycol compound, with all or a portion of remainder being the acidic aqueous solution. The slurry composition more preferably includes about 0.5 to about 1 weight percent of the glycol compound.

Method of Preparing a Slurry Composition

Figure 3:
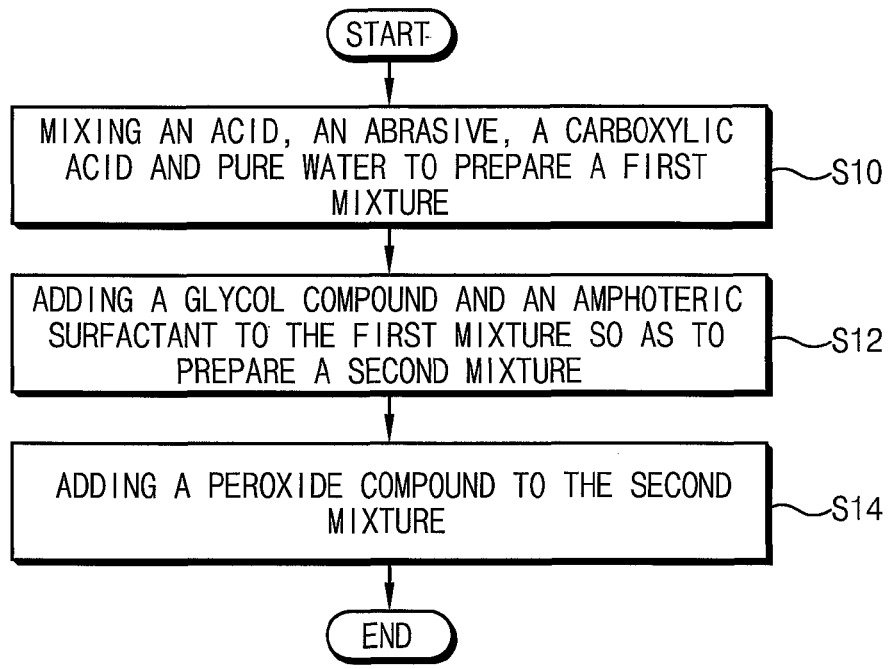
FIG. 3 is a flow chart for explaining a method of preparing a slurry composition in accordance with an embodiment of the present invention.

FIG. 3 is a flow chart for explaining a method of preparing a slurry composition according to an exemplary embodiment.

Referring to FIG. 3, a first mixture is prepared by mixing an acid, an abrasive, a carboxylic acid with pure water in step S10. The first mixture may be advantageously prepared by stirring the acid, the abrasive, the carboxylic acid and the pure water for several minutes to several hours. The acid may include, for example, nitric acid, sulfuric acid, hydrochloric acid, or phosphoric acid. The abrasive may include, for example, silica, ceria, alumina, titania, or zirconia. The carboxylic acid may include, for example, acetic acid, citric acid, glutaric acid, glycolic acid, formic acid, lactic acid, malic acid, maleic acid oxalic acid, phthalic acid, succinic acid, or tartaric acid.

After pressurizing the first mixture, the first mixture may be provided into a disperser. A homonizer or an ultrasonic disperser may be used as the disperser. The disperser may disperse the first mixture by collisions of particles in the first mixture so that the disperser may improve a dispersibility of the first mixture. Accordingly, the abrasive in the first mixture may be dispersed homogeneously.

In an exemplary embodiment, the first mixture may be then filtered.

After the first mixture is dispersed (and optionally filtered), a glycol compound and an amphoteric surfactant are added into the first mixture to form a second mixture in step S12. The glycol compound may include, for example, diethylene glycol, ethylene glycol, or polyethylene glycol. The amphoteric surfactant may include, for example, a betaine compound or an amino acid compound. Here, the amino acid compound may include, for example, lysine, proline, or arginine. The second mixture may be sufficiently stirred for several minutes to several hours.

Subsequently, a peroxide compound is added to the second mixture to prepare the slurry composition of the present embodiment in step S14. The peroxide compound may include, for example, hydrogen peroxide, benzoyl peroxide, calcium peroxide, barium peroxide, or sodium peroxide.

Method of Polishing an Object

Figure 4:
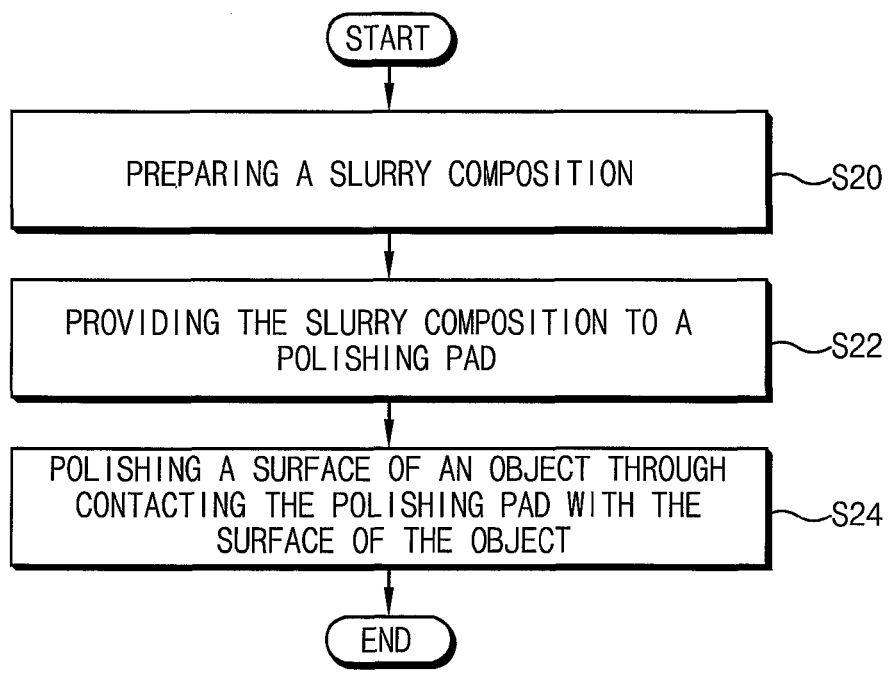
FIG. 4 is a flow chart for explaining a method of polishing an object using a slurry composition in accordance with an embodiment of the present invention.

FIG. 4 is a flow chart for explaining a method of polishing an object according to another exemplary embodiment.

Referring to FIG. 4, a slurry composition including an acidic aqueous solution, an amphoteric surfactant and a glycol compound is prepared at step S20. The acidic aqueous solution may include a pH-controlling agent such as potassium hydroxide (KOH) or tetramethylammonium hydroxide (TMAH).

The slurry composition is provided to a polishing pad at step S22, and then the surface of an object is polished by contacting the polishing pad with the surface of the object at step S24. In the polishing process, the polishing pad and the object are rotated relative to each other. The polishing pad may rotate in a direction substantially identical to that of the object. Alternatively, the polishing pad may rotate along a direction substantially opposed to that of the object.

The metal layer of the object may include a metal such as tungsten (W), aluminum (Al), titanium (Ti), tantalum (Ta), or copper (Cu). The object may be pressurized in the polishing process. Thus, the object may be chemically polished by the slurry composition, and also mechanically polished by rotating and pressurizing the object. More particularly, an oxidizing agent such as a peroxide compound and an acid in the acidic aqueous solution may oxidize the metal layer to form a metal oxide film on the metal layer. The metal oxide film may then be mechanically polished by an abrasive such as silica, ceria, titania, alumina or zirconia in the acidic aqueous solution.

In order to enhance polishing efficiency, the pH-controlling agent in the slurry composition may control a pH of the slurry composition relative to the metal included in the metal layer of the object so as to efficiently polish the object. The pH of the slurry composition may be in a range of about 1 to about 6. Particularly, when the object has the metal layer that includes tungsten, the pH of the slurry composition may be in a range of about 2 to about 4. When the object has the metal layer that includes copper or aluminum, the pH of the slurry composition may be in a range of about 4 to about 6.

The slurry composition for polishing an object such as a semiconductor substrate will be further explained in accordance with various Examples and Comparative Examples.

Preparing a Slurry Composition

EXAMPLE 1

A slurry composition was prepared by mixing about 50 g of silica, about 20 g of hydrogen peroxide, about 10 g of maleic acid, about 0.3 g of nitric acid, and about 4 g of lysine as an amphoteric surfactant with deionized water.

EXAMPLES 2 AND 3

Slurry compositions were prepared by performing processes substantially identical to that of Example 1 except for amphoteric surfactants. The amphoteric surfactants and contents of ingredients in the slurry compositions of Examples 2 and 3 are shown in following Table 1.

EXAMPLE 4

A slurry composition was prepared by mixing about 50 g of silica, about 20 g of hydrogen peroxide, about 10 g of maleic acid, about 0.3 g of nitric acid, and about 0.8 g of diethylene glycol with deionized water.

EXAMPLES 5 TO 7

Each of slurry compositions of Examples 5 to 7 was prepared by mixing about 50 g of silica, about 20 g of hydrogen peroxide, about 10 g of maleic acid, about 0.3 g of nitric acid, about 0.8 g of diethylene glycol, and about 4 g of an amphoteric surfactant with deionized water. Types of amphoteric surfactants and contents of the amphoteric surfactants in the slurry compositions of Examples 5 to 7 are shown in Table 1 which is presented below.

COMPARATIVE EXAMPLE 1

A conventional slurry composition was prepared. Particularly, SS W2000 slurry composition (trade name manufactured by Cabot Microelectronics Co., U.S.A) was prepared.

COMPARATIVE EXAMPLE 2

A slurry composition was prepared by mixing about 50 g of silica, about 20 g of hydrogen peroxide, about 10 g of maleic acid, and about 0.3 g of nitric acid with deionized water.

COMPARATIVE EXAMPLE 3

A slurry composition was prepared by mixing about 50 g of silica, about 1.8 g of hydrogen peroxide, about 10 g of maleic acid, and about 0.3 g of nitric acid with deionized water.

COMPARATIVE EXAMPLE 4

A slurry composition was prepared by mixing about 50 g of silica, about 20 g of hydrogen peroxide, about 10 g of maleic acid, about 0.3 g of nitric acid, and about 4 g of glycine with deionized water.

COMPARATIVE EXAMPLE 5

A slurry composition was prepared by mixing about 50 g of silica, about 1.8 g of hydrogen peroxide, about 10 g of maleic acid, about 0.3 g of nitric acid, about 4 g of glycine, and about 0.8 g of diethyl glycol with deionized water.

TABLE 1

|  | Silica [g] | Hydrogen Peroxide [g] | Maleic Acid [g] | Nitric Acid [g] | Deionized Water [g] | Amphoteric Surfactant [g] | Glycol Compound [g] |
| --- | --- | --- | --- | --- | --- | --- | --- |
| Comparative Example 2 | 50 | 20 | 10 | 0.3 | 919.7 | — | — |
| Comparative Example 3 | 50 | 1.8 | 10 | 0.3 | 937.9 | — | — |
| Comparative Example 4 | 50 | 20 | 10 | 0.3 | 915.7 | Glycine 4 | — |
| Comparative Example 5 | 50 | 1.8 | 10 | 0.3 | 933.1 | Glycine 4 | Diethylene glycol 0.8 |
| Example 1 | 50 | 20 | 10 | 0.3 | 915.7 | Lysine 4 | — |
| Example 2 | 50 | 20 | 10 | 0.3 | 915.7 | Proline 4 | — |

TABLE 1-continued

|  | Silica [g] | Hydrogen Peroxide [g] | Maleic Acid [g] | Nitric Acid [g] | Deionized Water [g] | Amphoteric Surfactant [g] | | Glycol Compound [g] | |
|---|---|---|---|---|---|---|---|---|---|
| Example 3 | 50 | 20 | 10 | 0.3 | 915.7 | Arginine | 4 | — | |
| Example 4 | 50 | 1.8 | 10 | 0.3 | 937.1 | — | | Diethylene glycol | 0.8 |
| Example 5 | 50 | 1.8 | 10 | 0.3 | 933.1 | Lysine | 4 | Diethylene glycol | 0.8 |
| Example 6 | 50 | 1.8 | 10 | 0.3 | 933.1 | Proline | 4 | Diethylene glycol | 0.8 |
| Example 7 | 50 | 1.8 | 10 | 0.3 | 933.1 | Arginine | 4 | Diethylene glycol | 0.8 |

Estimation of a Size of a Void Relative to a Wet Etch Rate

Wet etch rates of tungsten layers were estimated according to variations in hydrogen peroxide concentrations in the slurry compositions. Here, the slurry compositions were prepared by processes substantially identical to that of Comparative Example 2 except for the concentrations of hydrogen peroxide. The wet etch rates were estimated using blanket wafers that include tungsten layers, respectively. Oxide layers having thicknesses of about 1,000 Å were formed on semiconductor substrates including polysilicon, and tungsten layers having thicknesses of about 10,000 Å were formed on the oxide layers, thereby forming the blanket wafers. CMP processes were performed using the slurry compositions. After the CMP processes, sizes of voids generated in the tungsten layers were measured.

Figure 5:
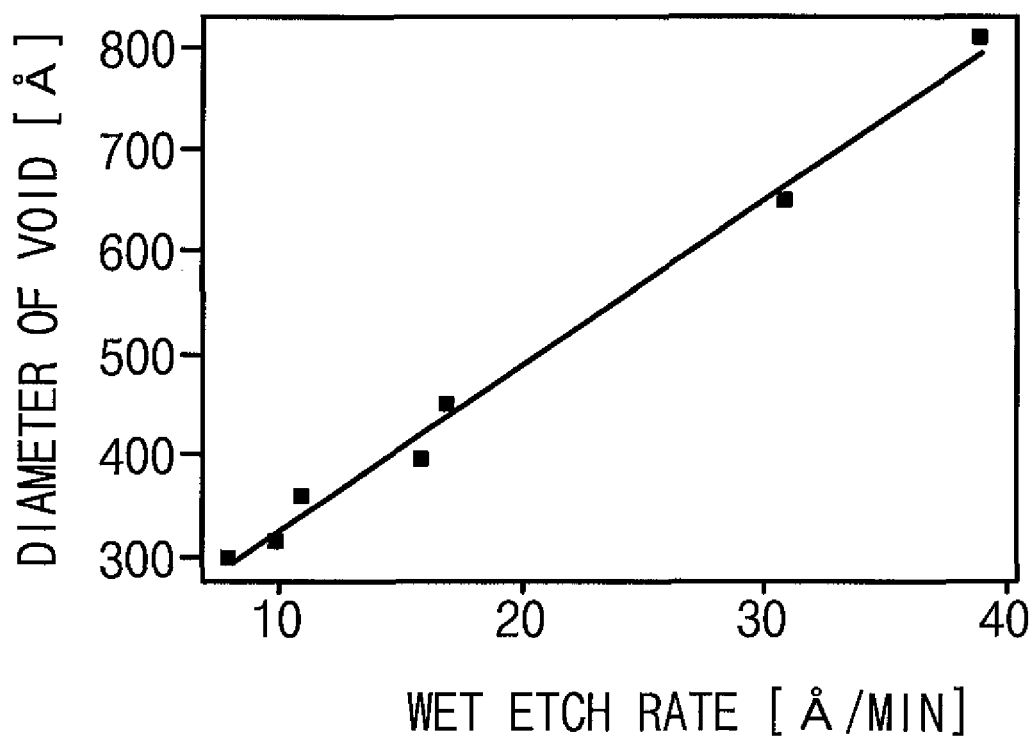
FIG. 5 is a graph illustrating the diameters of void generated in a metal layer relative to various wet etch rates.

FIG. 5 is a graph illustrating the diameters of the voids relative to the wet etch rate of the tungsten layer.

Referring to FIG. 5, the diameter of the voids generated in the tungsten layer are substantially proportional to the wet etch rate of the tungsten layer (an $R^2$ value is greater than about 99%). Thus, the wet etch rate of the tungsten layer may indirectly represent the diameter of the void generated in the tungsten layer. Accordingly, the size of the void may be estimated by measuring a wet etch rate of a metal layer using various slurry compositions.

Estimation of Wet Etch Rate Relative to Types of Amphoteric Surfactant

Wet etch rates of tungsten layers were estimated using the slurry compositions according to Comparative Examples 1, 2 and 4, and Examples 1 to 3. The wet etch rates of the tungsten layers were estimated using blanket wafers including the tungsten layers. Oxide layers having thicknesses of about 1,000 Å were formed on silicon substrates and the tungsten layers having thicknesses of about 10,000 Å were formed on the oxide layers, thereby forming the blanket wafers. The slurry compositions according to Comparative Example 4 and Examples 1 to 3 were prepared as follows.

Firstly, about 50 g of silica, about 915.7 g of deionized water, about 10 g of maleic acid and about 0.3 g of nitric acid were stirred in a flask at about 2,000 rpm for about 2 hours to form a mixture. Subsequently, the stirred mixture was dispersed under a pressure of about 1,200 psi using a high-pressure dispersion process. Surfactants were respectively added to the dispersed mixture and the mixture was additionally stirred for about 30 minutes. About 20 g of hydrogen peroxide was added to the mixture to thereby prepare the slurry compositions in accordance with Examples 1 to 3 and Comparative Example 4. The slurry composition of Comparative Example 2 was prepared by a process substantially identical to that of Example 1, whereas the amphoteric surfactant was not added into the slurry composition of Comparative Example 2. The blanket wafers were immersed into the slurry compositions, and then the wet etch rates of the tungsten layers were estimated by measuring the thicknesses of the tungsten layers relative to immersing time.

The wet etch rates of the tungsten layers relative to various amphoteric surfactants are shown in following Table 2.

TABLE 2

|  | Wet Etch Rate [Å/min] |
|---|---|
| Comparative Example 1 | 1,734 |
| Comparative Example 2 | 503 |
| Comparative Example 4 | 176 |
| Example 1 | 705 |
| Example 2 | 290 |
| Example 3 | 170 |

Referring to Table 2, the wet etch rates of the tungsten layers relative to the slurry compositions including amphoteric surfactants according to Examples 2 and 3 are remarkably lower than those of the tungsten layers relative to the slurry compositions according to Comparative Examples 1 and 2. As the size of the voids is smaller, the wet etch rate of the tungsten layer may be reduced. Therefore, the slurry composition including the amphoteric surfactant may effectively protect a metal layer such as the tungsten layer. In addition, the voids generated in the metal layer may be reduced by employing the slurry composition of the present embodiments in the CMP process for polishing a metal layer.

Estimation of Stability of an Oxidizing Agent

The stability of hydrogen peroxide in the slurry compositions according to Comparative Example 3 and Example 4 was estimated.

The slurry composition according to Example 4 was prepared as follows. Firstly, about 50 g of silica, about 937.1 g of deionized water, about 10 g of maleic acid and about 0.3 g of nitric acid were stirred with about 2,000 rpm for about 2 hours in a flask to form a mixture. Subsequently, the stirred mixture was dispersed under a pressure of about 1,200 psi using a high-pressure dispersion process. About 0.8 g of diethylene glycol was added to the dispersed mixture and the mixture was additionally stirred for about 30 minutes. About 1.8 g of hydrogen peroxide was added into the mixture to prepare the slurry composition in accordance with Example 4. The slurry composition of Comparative Example 3 was prepared by a process substantially identically to that of Example 4, whereas diethylene glycol was not added into the slurry composition of Comparative Example 3.

The stability of the oxidizing agent was estimated by measuring a concentration variation of hydrogen peroxide relative to time after preparing the slurry composition.

FIG. 6 is a graph illustrating the concentration variation of hydrogen peroxide relative to time after preparing a slurry composition.

Referring to FIG. 6, when the slurry composition does not include the diethylene glycol as a stabilizer of hydrogen peroxide, the concentration of the hydrogen peroxide drastically decreases after preparing the slurry composition, and is reduced to less than about 50% after about 24 hours from preparing the slurry composition. However, when the slurry composition includes the diethylene glycol as the stabilizer of the hydrogen peroxide, the hydrogen peroxide in the slurry composition has a relatively constant concentration as shown in FIG. 6.

Therefore, in a CMP process for polishing a metal layer, the concentration of the hydrogen peroxide may be significantly stabilized by adding the glycol compound into the slurry composition. That is, the slurry composition according to exemplary embodiments may have a constant concentration of hydrogen peroxide, and the oxidizing power of the slurry composition may not decrease. As a result, a polishing rate of the metal layer may be maintained in the CMP process.

Estimation of Polishing Rate

A polishing rate of a metal layer such as a tungsten layer was estimated using the slurry compositions according to Comparative Examples 3 and 5, and Examples 5 to 7. The polishing rate of the tungsten layer is shown in Table 4 which is presented below.

The polishing rate of the tungsten layer was estimated using blanket wafers including the tungsten layers. Each of the blanket wafers was prepared as follows.

Firstly, an oxide layer having a thickness of about 1,000 Å was formed on a silicon substrate, and then a titanium nitride layer having a thickness of about 1,000 Å was formed on the oxide layer. Subsequently, the tungsten layer having a thickness of about 10,000 Å was formed on the titanium nitride layer.

In polishing the blanket wafers using the slurry compositions according to Comparative Examples 3 and 5, and Examples 5 to 7, the polishing rates of the tungsten layer were measured. The blanket wafers including the tungsten layers were polished using an STRASBAUGH 6EC apparatus (trade name manufactured by Strasbaugh, U.S.A), and polishing conditions are shown in Table 3.

TABLE 3

| | |
|---|---|
| Polishing Pad Type | IC1000/SubaIV Stacked |
| Platen Speed | 25 rpm |
| Head Speed | 20 rpm |
| Down Pressure | 7 psi |
| Back Pressure | 0 psi |
| Temperature | 25° C. |
| Slurry Flow | 250 mL/min |

TABLE 4

| | Relative Polishing Rate [%] |
|---|---|
| Comparative Example 3 | 100 |
| Comparative Example 5 | 71 |
| Example 5 | 89 |
| Example 6 | 86 |
| Example 7 | 72 |

Referring to Table 4, the polishing rates in CMP processes using the slurry compositions according to Examples 5 to 7 and Comparative Example 5 are slower by about 10% to about 30% than that of Comparative Example 3. The slurry composition of exemplary embodiments includes an amphoteric surfactant as a protector of a metal layer. Particularly, since the amphoteric surfactant in the slurry composition may be adsorbed on a surface of the tungsten layer, an oxidation rate of the metal layer may be reduced, and the polishing rate of the metal layer may also decrease. However, the voids generated in the metal layer by the oxidizing agents may be effectively removed. In addition, when the blanket wafer having the metal layer is polished using the slurry composition including the amphoteric surfactant such as proline, lysine and arginine according to Examples 5 to 7, the polishing rate of the metal layer further decreases so that the polishing rate of the metal layer using each of the slurry compositions of Examples 5 to 7 becomes lower than that of the metal layer using the slurry composition including the glycine according to Comparative Example 5.

Therefore, the slurry compositions of exemplary embodiments may effectively protect the metal layer including, for example, tungsten or aluminum, and simultaneously reduce the decrease of the polishing rate of the metal layer.

According to the present invention, a slurry composition may be used in a polishing process for an object such as a semiconductor substrate having a metal layer and/or an oxide layer. Thus, damage to the metal layer may be effectively prevented. In addition, the stability of an oxidizing agent in the slurry composition may be enhanced to thereby achieve a favorably constant polishing rate.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and the present invention is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A method of preparing a slurry composition used for polishing an object having a metal, the method comprising:
    mixing an acid, an abrasive, a carboxylic acid and pure water to prepare a first mixture;
    pressurizing and dispersing the first mixture;
    adding a glycol compound and an amphoteric surfactant to the pressurized and dispersed first mixture to prepare a second mixture; and
    adding a peroxide compound to the second mixture,
    wherein the glycol compound acts in the slurry composition to reduce decomposition of the peroxide compound to maintain a constant concentration of the peroxide compound in the slurry composition.

2. The method of claim 1, further comprising filtering the second mixture.

3. The method of claim 1, wherein the amphoteric surfactant comprises an amino acid compound to function as a corrosion inhibitor for the metal to which the slurry composition is applied.

4. The method of claim 3, wherein the metal comprises tungsten.

5. The method of claim 1, wherein the amphoteric surfactant comprises at least one selected from the group consisting of lysine, proline and arginine.

6. A method of polishing an object, comprising:
preparing a slurry composition by mixing an acid, an abrasive, a carboxylic acid, and pure water to form a first mixture, pressurizing and dispersing the first mixture, and adding to the first mixture an amphoteric surfactant and a glycol compound;
providing the slurry composition to a polishing pad; and
polishing a surface of an object by contacting the polishing pad with the slurry composition against the surface of the object, the surface of the object having a metal.

7. The method of claim 6, wherein the metal comprises at least one selected from the group consisting of tungsten (W), aluminum (Al) and copper (Cu).

8. The method of claim 6, wherein the metal comprises tungsten and the slurry composition has a pH of about 2to about 4.

9. The method of claim 6, wherein the metal comprises at least one of aluminum and copper, and the slurry composition has a pH of about 4to about 6.

10. The method of claim 6, wherein the acidic aqueous solution comprises a peroxide compound, and the glycol compound acts in the slurry composition to reduce decomposition of the peroxide compound to maintain a constant concentration of the peroxide compound in the slurry composition.

11. The method of claim 6, wherein the glycol compound comprises at least one selected from the group consisting of diethylene glycol, ethylene glycol and polyethylene glycol.

12. The method of claim 6, wherein the surface of the object comprises a tungsten layer.

13. The method of claim 6, wherein the amphoteric surfactant comprises an amino acid compound to function as a corrosion inhibitor for the metal.

14. The method of claim 13, wherein the amino acid compound comprises at least one selected from the group consisting of lysine, proline and arginine.

15. The method of claim 6, wherein the acidic aqueous solution comprises a perxodie compound, an acid, an abrasive, a carboxylic acide and pure water.

* * * * *